(12) United States Patent
Wang (10) Patent No.: US 10,886,144 B2
(45) Date of Patent: Jan. 5, 2021

(54) METHOD FOR DOPING LAYER, THIN FILM TRANSISTOR AND METHOD FOR FABRICATING THE SAME

(71) Applicants: ORDOS YUANSHENG OPTOELECTRONICS CO., LTD., Inner Mongolia (CN); BOE TECHNOLOGY GROUP CO., LTD., Beijing (CN)

(72) Inventor: Xuewei Wang, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/337,959

(22) PCT Filed: May 18, 2018

(86) PCT No.: PCT/CN2018/087484
§ 371 (c)(1),
(2) Date: Mar. 29, 2019

(87) PCT Pub. No.: WO2018/210335
PCT Pub. Date: Nov. 22, 2018

(65) Prior Publication Data
US 2020/0027720 A1     Jan. 23, 2020

(30) Foreign Application Priority Data

May 19, 2017   (CN) .......................... 2017 1 0357418

(51) Int. Cl.
*H01L 21/426* (2006.01)
*H01L 21/02* (2006.01)
(Continued)

(52) U.S. Cl.
CPC ........ *H01L 21/426* (2013.01); *H01L 21/0257* (2013.01); *H01L 21/02351* (2013.01);
(Continued)

(58) Field of Classification Search
CPC ........... H01L 29/66803; H01L 21/0415; H01L 21/046; H01L 21/2253; H01L 21/425;
(Continued)

(56) References Cited

U.S. PATENT DOCUMENTS 4,771,012 A * 9/1988 Yabu ....................... H01L 29/78
                                                         438/286
5,082,796 A   1/1992 El-Diwany et al.
(Continued)

FOREIGN PATENT DOCUMENTS

CN    101789377 A   7/2010
CN    107154346 A   9/2017
JP    H05082549 A   4/1993

OTHER PUBLICATIONS

First Office Action for Chinese Patent Application No. 201710357418.1 dated Mar. 4, 2019.
(Continued)

*Primary Examiner* — Eduardo A Rodela
(74) *Attorney, Agent, or Firm* — Calfee, Halter & Griswold LLP (57) ABSTRACT

A method for doping a layer, a thin film transistor and a method for fabricating the thin film transistor. The method comprises: forming a layer to be doped on a substrate by a first patterning process, wherein the layer comprises a first region, a second region and a third region, the first region is arranged in a middle region, the third region is arranged in an edge region, the second region is arranged between the first region and the third region; forming a first blocking layer and a second blocking layer on the layer in this order
(Continued)

by a second patterning process, wherein an orthographic projection region of the first blocking layer on the layer exactly covers the first region, and an orthographic projection region of the second blocking layer on the layer exactly covers the first region and the second region; perform a first doping on the layer with an ion beam perpendicular to the substrate, to realize doping of the third region; rotating the substrate by a preset angle in a direction parallel to the ion beam, so that the second blocking layer does not shield the second region, and performing a second doping on the layer with the ion beam.

17 Claims, 10 Drawing Sheets (51) Int. Cl.
H01L 21/8234 (2006.01)
H01L 21/04 (2006.01)
H01L 21/425 (2006.01)

(52) U.S. Cl.
CPC ........ *H01L 21/046* (2013.01); *H01L 21/0415* (2013.01); *H01L 21/425* (2013.01); *H01L 21/823418* (2013.01)

(58) Field of Classification Search
CPC ............. H01L 21/426; H01L 21/76825; H01L 21/76859
See application file for complete search history.

(56) References Cited

U.S. PATENT DOCUMENTS

| | | | |
|---|---|---|---|
| 5,258,319 A * | 11/1993 | Inuishi | H01L 21/26586 257/344 |
| 5,510,279 A * | 4/1996 | Chien | H01L 29/1045 257/E21.345 |
| 5,518,949 A * | 5/1996 | Chen | H01L 29/66772 438/404 |
| 5,627,087 A | 5/1997 | Hsu | |
| 6,130,134 A * | 10/2000 | Chen | H01L 29/66825 257/E21.345 |
| 6,200,862 B1 * | 3/2001 | Gardner | H01L 21/823425 257/E21.427 |
| 6,291,325 B1 * | 9/2001 | Hsu | H01L 21/26586 257/E21.345 |
| 2003/0057489 A1 * | 3/2003 | Yamazaki | H01L 21/76264 257/347 |
| 2003/0100151 A1 * | 5/2003 | Okamoto | H01L 29/66757 438/163 |
| 2003/0124778 A1 * | 7/2003 | Doi | H01L 27/1288 438/151 |
| 2003/0174267 A1 * | 9/2003 | Nimura | G02F 1/133553 349/113 |
| 2004/0121551 A1 * | 6/2004 | Wang | H01L 21/26586 438/302 |
| 2004/0164304 A1 * | 8/2004 | Magri | H01L 29/66719 257/73 |
| 2004/0219724 A1 * | 11/2004 | Park | H01L 29/1083 438/197 |
| 2010/0133544 A1 | 6/2010 | Liao et al. | |
| 2011/0215337 A1 * | 9/2011 | Egami | H01L 29/04 257/72 |
| 2018/0033808 A1 * | 2/2018 | Li | H01L 29/42384 |

OTHER PUBLICATIONS

Search Report and Written Opinion for International Application No. PCT/CN2018/087484 dated Jul. 31, 2018.

* cited by examiner

Fig. 1 forming a layer to be doped on a substrate by a first patterning process, wherein the layer comprises a first region, a second region and a third region, the first region is arranged in a middle region of the layer, the third region is arranged in an edge region of the layer, and the second region is arranged between the first region and the third region — S201 forming a first blocking layer and a second blocking layer in this order for blocking an ion beam on the layer by a second patterning process, wherein an orthographic projection region of the first blocking layer on the layer exactly covers the first region, and an orthographic projection region of the second blocking layer on the layer exactly covers the first region and the second region — S202 performing a first doping on the layer with an ion beam perpendicular to the substrate, to realize doping of the third region — S203 rotating the substrate by a preset angle in a direction parallel to the ion beam, so that the second blocking layer does not shield the second region, and performing a second doping on the layer with the ion beam to realize doping of the second region, wherein a dose of doping ion for the second doping smaller is than the first doping — S204

Fig. 5b forming a semiconductor layer on the substrate by a first patterning process, wherein the semiconductor layer comprises a first region, a second region and a third region, the first region is arranged in a middle region of the semiconductor layer, the third region is arranged in an edge region of the semiconductor layer, and the second region is arranged between the first region and the third region ⎯ S601 forming a first blocking layer and a second blocking layer for blocking an ion beam on the semiconductor layer in this order by a second patterning process, wherein an orthographic projection region of the first blocking layer on the semiconductor layer exactly covers the first region, and an orthographic projection region of the second blocking layer on the semiconductor layer exactly covers the first region and the second region ⎯ S602 performing a first doping on the semiconductor layer with an ion beam perpendicular to the substrate ⎯ S603 rotating the substrate by a preset angle in a direction parallel to the ion beam, so that the second blocking layer does not shield the second region, perform a second doping on the semiconductor layer with the ion beam to form the semiconductor active layer, and a dose of doping ion for the second doping is smaller than the first doping ⎯ S604

Fig. 10 forming a gate and an insulating layer on the substrate by a seventh patterning process and forming a semiconductor layer by a first patterning process, wherein the semiconductor layer comprises a first region, a second region and a third region, the first region is arranged in a middle region of the semiconductor layer, the third region is arranged in an edge region of the semiconductor layer, and the second region is arranged between the first region and the third region —S1101 forming a first blocking layer and a second blocking layer for blocking an ion beam on the semiconductor layer in this order by a second patterning process, wherein an orthographic projection region of the first blocking layer on the semiconductor layer exactly covers the first region, and an orthographic projection region of the second blocking layer on the semiconductor layer exactly covers the first region and the second region —S1102 performing a first doping on the semiconductor layer with an ion beam perpendicular to the substrate —S1103 rotating the substrate by a preset angle in a direction parallel to the ion beam, so that the second blocking layer does not shield the second region, and performing a second doping on the semiconductor layer with the ion beam, to form a semiconductor active layer, wherein a dose of doping ion for the second doping smaller is than the first doping —S1104 removing the first blocking layer and the second blocking layer, and forming a source and a drain on the semiconductor active layer by an eighth patterning process —S1105

METHOD FOR DOPING LAYER, THIN FILM TRANSISTOR AND METHOD FOR FABRICATING THE SAME

RELATED APPLICATIONS

The present application is the U.S. national phase entry of PCT/CN2018/087484, with an international filing date of May 18, 2018, which claims the benefit of Chinese Patent Application No. 201710357418.1, filed on May 19, 2017, the entire disclosure of which is incorporated herein by reference.

TECHNICAL FIELD

The present disclosure relates to the field of display technologies, and particularly to a method for doping a layer, a thin film transistor and a method for fabricating the same.

BACKGROUND

In backplate techniques for liquid crystal display (LCD) and active matrix organic light emitting diode (AMOLED) as well as processes for semiconductor devices, a semiconductor layer is generally doped several times by different ions at different doses, to improve the electrical characteristics of a thin film transistor (TFT).

SUMMARY

In an exemplary embodiment, a method for doping a layer, comprises:

forming a layer to be doped on a substrate by a first patterning process, wherein the layer comprises a first region, a second region and a third region, the first region is arranged in a middle region of the layer, the third region is arranged in an edge region of the layer, and the second region is arranged between the first region and the third region;

forming a first blocking layer and a second blocking layer for blocking an ion beam on the layer in this order by a second patterning process, wherein an orthographic projection region of the first blocking layer on the layer exactly covers the first region, and an orthographic projection region of the second blocking layer on the layer exactly covers the first region and the second region;

performing a first doping on the layer with an ion beam perpendicular to the substrate, to realize doping of the third region; and rotating the substrate by a preset angle in a direction parallel to the ion beam, so that the second blocking layer does not shield the second region, and performing a second doping on the layer with the ion beam to realize doping of the second region.

In some exemplary embodiments, rotating the substrate by a preset angle in a direction parallel to the ion beam, so that the second blocking layer does not shield the second region, and performing a second doping on the layer with the ion beam to realize doping of the second region, comprises:

rotating the substrate clockwise by a preset angle in a direction parallel to the ion beam, so that the second blocking layer does not shield the second region, performing a second doping on the layer with the ion beam, and, rotating the substrate counterclockwise by a preset angle in a direction parallel to the ion beam, so that the second blocking layer does not shield the second region, performing the second doping on the layer again with the ion beam, to realize doping of the second region.

In some exemplary embodiments, the preset angle A satisfies tan $A=L/(H1+H2)$; wherein:

L indicates a length of the second region in a preset direction, H1 indicates a thickness of the layer, and H2 indicates a thickness of the first blocking layer.

In one or more embodiments, the first blocking layer and the second blocking layer are made from a same material.

In some exemplary embodiments, after performing the second doping on the layer with the ion beam, the method further comprises: removing the first blocking layer and the second blocking layer to form a doped layer.

In one or more embodiments, a dose of doping ion for the second doping smaller is than the first doping.

Some exemplary embodiments further provide a method for fabricating a thin film transistor, comprising forming a gate, a source, a drain, and a semiconductor active layer, wherein forming the semiconductor active layer comprises:

forming a semiconductor layer on the substrate by a first patterning process, wherein the semiconductor layer comprises a first region, a second region and a third region, the first region is arranged in a middle region of the semiconductor layer, the third region is arranged in an edge region of the semiconductor layer, and the second region is arranged between the first region and the third region;

forming a first blocking layer and a second blocking layer for blocking an ion beam on the semiconductor layer in this order by a second patterning process, wherein an orthographic projection region of the first blocking layer on the semiconductor layer exactly covers the first region, and an orthographic projection region of the second blocking layer on the semiconductor layer exactly covers the first region and the second region;

performing a first doping on the semiconductor layer with an ion beam perpendicular to the substrate; and rotating the substrate by a preset angle in a direction parallel to the ion beam, so that the second blocking layer does not shield the second region, and performing a second doping on the semiconductor layer with the ion beam, to form a semiconductor active layer.

In one or more embodiments, prior to forming the semiconductor layer on the substrate by the first patterning process, the method further comprises:

forming a light shielding layer and a buffer layer on the substrate by a third patterning process.

In some exemplary embodiments, forming a first blocking layer and a second blocking layer for blocking an ion beam on the semiconductor layer in this order by a second patterning process, comprises:

forming an insulating layer and a gate on the semiconductor layer in this order by fourth patterning process, wherein the gate act as the first blocking layer, and an orthographic projection region of the gate on the semiconductor layer exactly covers the first region; and forming a second blocking layer for blocking an ion beam on the gate by a fifth patterning process, wherein an orthographic projection region of the second blocking layer on the semiconductor layer exactly covers the first region and the second region.

In some exemplary embodiments, after forming the semiconductor active layer, the method further comprises:

removing the second blocking layer, and forming a source and a drain on the semiconductor active layer by a sixth patterning process.

In some exemplary embodiments, the preset angle A satisfies tan $A=L/(H1+H2+H3)$; wherein:

L indicates a length of the second region in a preset direction, H1 indicates a thickness of the semiconductor layer, H2 indicates a thickness of a portion of the insulating layer which is arranged right above the second region, and H3 indicates a thickness of the gate.

In some exemplary embodiments, prior to forming the semiconductor layer on the substrate by the first patterning process, the method further comprises:

forming a gate and an insulating layer on the substrate in this order by a seventh patterning process.

In some exemplary embodiments, after forming the semiconductor active layer, the method further comprises:

removing the first blocking layer and the second blocking layer, and forming a source and a drain on the semiconductor active layer by an eighth patterning process.

In some exemplary embodiments, the preset angle A satisfies tan A=L/(H1+H2); wherein:

L indicates a length of the second region in a preset direction, H1 indicates a thickness of the semiconductor layer, and H2 indicates a thickness of the first blocking layer.

In some exemplary embodiments, the first blocking layer and the second blocking layer are made from a same material.

In some exemplary embodiments, a dose of doping ion for the second doping smaller is than the first doping.

In some exemplary embodiments, rotating the substrate by a preset angle in a direction parallel to the ion beam, so that the second blocking layer does not shield the second region, and performing a second doping on the semiconductor layer with the ion beam, to form a semiconductor active layer, comprises:

rotating the substrate clockwise by a preset angle in a direction parallel to the ion beam, so that the second blocking layer does not shield the second region, performing a second doping on the semiconductor layer with the ion beam, and, rotating the substrate counterclockwise by a preset angle in a direction parallel to the ion beam, so that the second blocking layer does not shield the second region, performing the second doping on the semiconductor layer again with the ion beam, to form the semiconductor active layer.

Some exemplary embodiments further provide a thin film transistor, which is fabricated by any method described above.

DETAILED DESCRIPTION OF EMBODIMENTS

Figure 1:
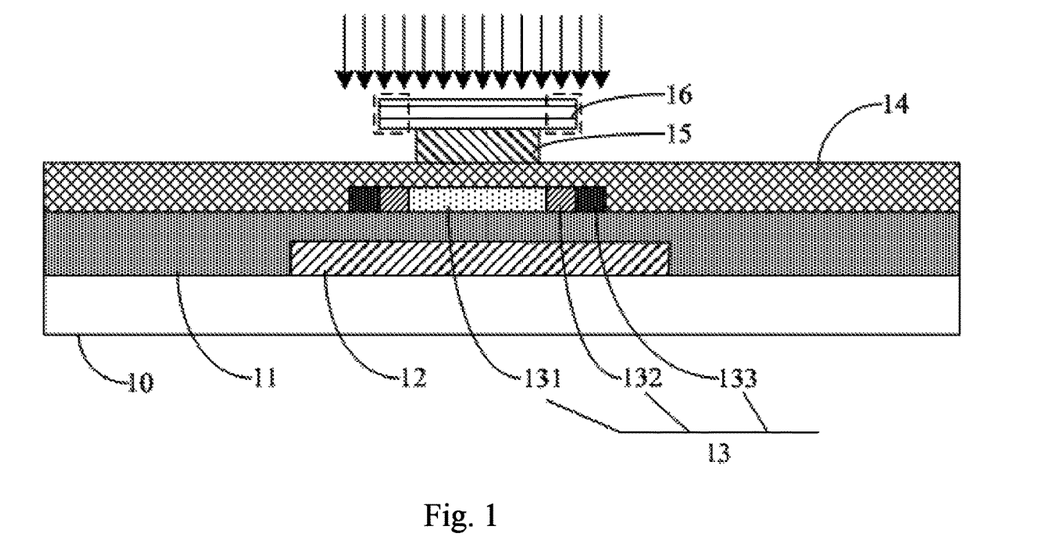
FIG. 1 is a partial structural view for an existing thin film transistor.

As shown in FIG. 1, a top-gate thin film transistor comprises a light shielding layer 12, a buffer layer 11, a semiconductor active layer 13, an insulating layer 14, a gate 15, a source and a drain (not shown) which are arranged on a substrate 10 in this order. The semiconductor active layer 13 comprises an undoped region 131, a lightly doped region 132 and a heavily doped region 133. The undoped region 131 corresponds to a channel region of the semiconductor active layer 13, and the heavily doped region 133 and the lightly doped region 132 correspond to ohmic contact regions of the semiconductor active layer 13. The lightly doped region 132 is namely a lightly doped drain (LDD) structure, which intends to reduce the electric field in a drain region and prevent hot electron degradation effect.

As shown in FIG. 1, in case the semiconductor active layer 13 is doped, firstly, the gate 15 is covered by a photoresist layer 16, and the orthographic projection region of the photoresist layer 16 on the substrate 10 exactly covers the undoped region 131 and the lightly doped region 132 of the semiconductor active layer 13. Then, the heavily doped region 133 of the semiconductor active layer 13 is doped by an ion beam at a relatively large dose, and the direction of the ion beam is perpendicular to the substrate 10 (a direction shown by arrows in the figure), to form the heavily doped region 133 of the semiconductor active layer 13. Then, the lightly doped region 132 of the semiconductor active layer 13 is doped by an ion beam at a relatively small dose. At this time, since the lightly doped region 132 is covered by a portion of the photoresist layer 16 which thus blocks the doping ions, it is required to remove this portion of the photoresist layer, i.e., a portion of the photoresist layer shown by a dashed box in the drawing. After this portion of the photoresist layer is removed, doping at a relatively small dose is performed to form the lightly doped region 132 of the semiconductor active layer 13.

To sum up, doping at different doses requires removing a portion of the photoresist layer, e.g., the photoresist layer in the dashed box of FIG. 1, by exposing and etching. On one hand, this results in a cumbersome process which makes it difficult to control various parameters. For example, it is difficult to control parameters of ashing. As a result, the lightly doped region length can not be defined efficiently, and critical electrical characteristic parameters like leakage current are affected. On the other hand, a stripping process for removing the photoresist may suffer from photoresist residuals, so as to cause defects in the back end process. This not only reduces yield, but also reduces capacity.

Embodiments of the present disclosure provide a method for doping a layer, a thin film transistor and a method for fabricating the same, which intend to simplify the process, improve the capacity, and increase the yield of product.

To make the objects, the technical solutions and the advantages of embodiments of the present disclosure more apparent, the technical solutions of the embodiments of the present disclosure will be described in detail hereinafter in conjunction with the drawings of exemplary embodiments of the present disclosure. The embodiments described hereinafter are only some embodiments of the present disclosure, but not all embodiments. As a result of the exemplary embodiments described hereinafter, other embodiments obtained by those skilled in the art should fall within the scope of the present disclosure.

A method for doping a layer in an exemplary embodiment will be described hereinafter by referring to the accompanying drawings. The thickness of layers and the size and shape of regions in the drawings do not reflect the real scale of layers, but are only intended to illustrate the contents of the present disclosure.

Figure 2:
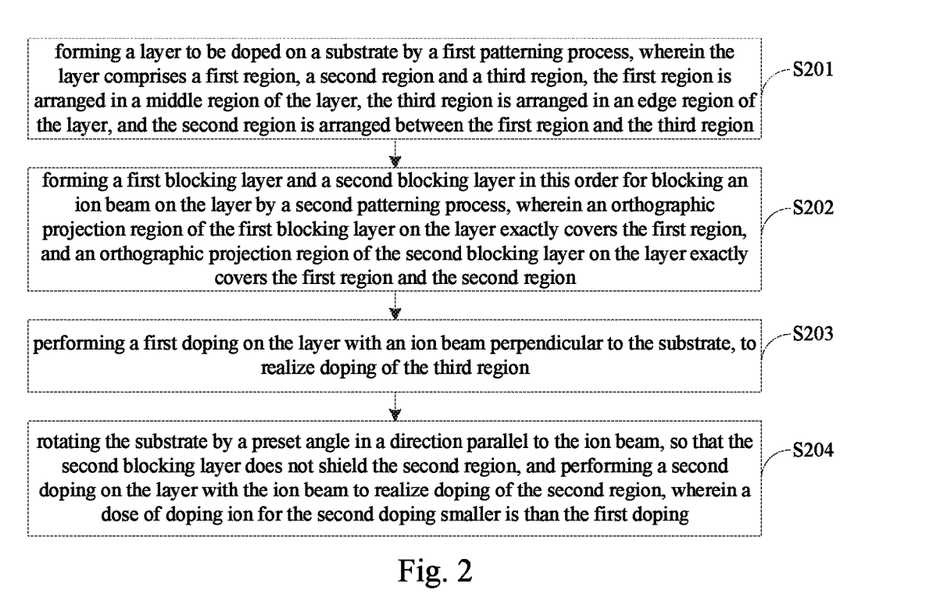
FIG. 2 is a flow chart for a method for doping a layer in an exemplary embodiment.

As shown in FIG. 2, in an exemplary embodiment, a method for doping a layer comprises the following steps.

S201, forming a layer to be doped on a substrate by a first patterning process, wherein the layer comprises a first region, a second region and a third region, the first region is arranged in a middle region of the layer, the third region is arranged in an edge region of the layer, and the second region is arranged between the first region and the third region;

S202, forming a first blocking layer and a second blocking layer in this order for blocking an ion beam on the layer by a second patterning process, wherein an orthographic projection region of the first blocking layer on the layer exactly covers the first region, and an orthographic projection region of the second blocking layer on the layer exactly covers the first region and the second region;

S203, performing a first doping on the layer with an ion beam perpendicular to the substrate, to realize doping of the third region;

S204, rotating the substrate by a preset angle in a direction parallel to the ion beam, so that the second blocking layer does not shield the second region, and performing a second doping on the layer with the ion beam to realize doping of the second region, wherein a dose of doping ion for the second doping smaller is than the first doping.

In particular, the first region is the undoped region of layer, the second region is the lightly doped region of the layer, and the third region is the heavily doped region of the layer. The term "exactly covers" as used herein means "completely overlaps". For example, the orthographic projection region of the first blocking layer on the layer exactly covers the first region means that the orthographic projection region of the first blocking layer on the layer completely overlaps the first region of the layer.

In particular, in an exemplary embodiment, rotating the substrate by a preset angle in a direction parallel to the ion beam, so that the second blocking layer does not shield the second region, and performing a second doping on the layer with the ion beam to realize doping of the second region, particularly comprises:

rotating the substrate clockwise by a preset angle in the direction parallel to the ion beam, so that the second blocking layer does not shield the second region, and performing the second doping on the layer with the ion beam, and rotating the substrate counterclockwise by a preset angle in a direction parallel to the ion beam, so that the second blocking layer does not shield the second region, performing the second doping on the layer again with the ion beam, to realize doping of the second region.

The process for doping a layer in an exemplary embodiment will be described hereinafter by referring to the accompanying drawings.

Figure 3:
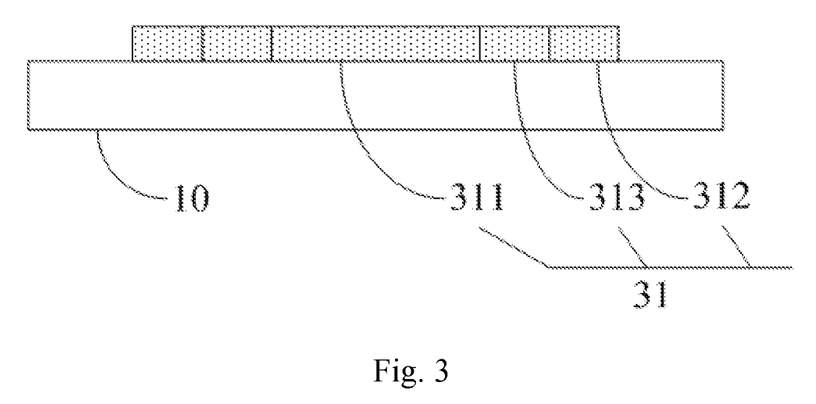
FIGS. 3, 4, 5a and 5b are structural views for different stages of a layer doping process in an exemplary embodiment.

As shown in FIG. 3, a layer to be doped 31 is formed on the substrate 10 by a patterning process. The layer 31 comprises a first region 311, a second region 313 and a third region 312. The first region 311 is arranged in a middle region of the layer 31, the third region 312 is arranged in an edge region of the layer 31, and the second region 313 is arranged between the first region 311 and the third region 312. The first region 311 corresponds to an undoped region of the layer 31, the third region 312 corresponds to a heavily doped region of the layer 31, and the second region 313 corresponds to a lightly doped region of the layer 31. In an exemplary embodiment, the patterning process comprises some or all of the following processes: coating photoresist, exposing, developing, etching, and removing photoresist. In an exemplary embodiment, the substrate 10 can be a glass substrate, or other types of substrate, such as a quartz substrate. In an exemplary embodiment, the layer 31 can be a semiconductor layer.

Figure 4:
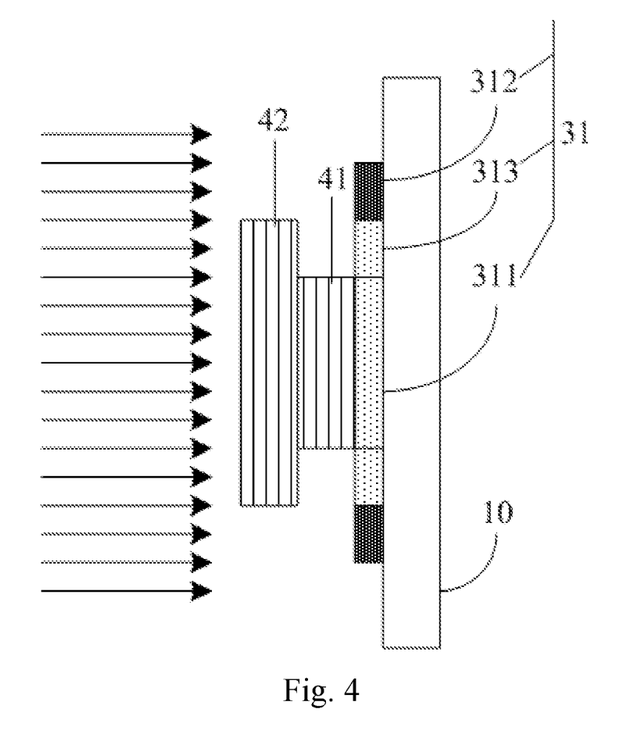

As shown in FIG. 4, then, a first blocking layer 41 and a second blocking layer 42 are formed on the layer 31 by a patterning process in this order for blocking an ion beam. An orthographic projection region of the first blocking layer 41 on the layer 31 exactly covers the first region 311, and an orthographic projection region of the second blocking layer 42 on the layer 31 exactly covers the first region 311 and the second region 313. In an exemplary embodiment, the first blocking layer 41 and the second blocking layer 42 are made from a same material. In practice, the first blocking layer 41 and the second blocking layer 42 can be made from a photoresist layer. Of course, in practice, another type of blocking layer can further be selected, provided that it can block ions which are implanted in the ion doping process.

Then, as shown in FIG. 4, a first doping is performed on the layer 31 with an ion beam perpendicular to the substrate 10 (ion beam is implanted in a direction as shown by arrows in the figure), to realize doping of the third region 312 of the layer 31. During the first doping, since the first region 311 and the second region 313 are shielded by the first blocking layer 41 and the second blocking layer 42, the first region 311 and the second region 313 of the layer 31 are not doped during the first doping. In an exemplary embodiment, during the first doping, the doping ion is implanted by the ion beam at a relatively large dose, e.g., n type doping ion or p type doping ion with a relatively large implantation dose.

Figure 5A:
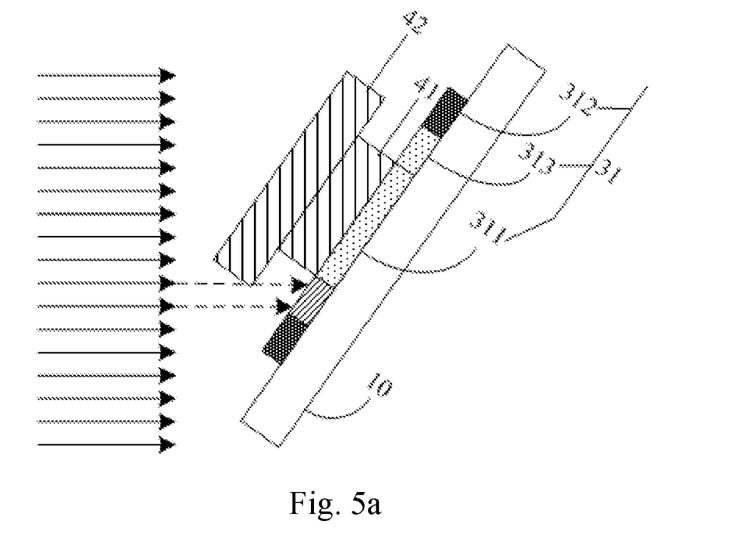

Then, as shown in FIG. 5a, the substrate 10 is rotated clockwise by a preset angle A in a direction parallel to the ion beam, so that the second blocking layer 42 does not shield the second region 313, and a second doping is performed on the layer 31 with the ion beam, to realize doping of the second region 313 below the first region 311. In an exemplary embodiment, during the second doping, the doping ion is implanted by the ion beam at a relatively small dose. In an exemplary embodiment, the preset angle A to rotate is such an angle that after rotation in the direction parallel to the ion beam by the preset angle A, the substrate 10 can expose the second region 313. In practice, the preset angle A satisfies tan $A=L/(H1+H2)$; wherein L indicates a length of the second region 313 in a preset direction (e.g., of the second region 313 in a direction parallel to the substrate 10), H1 indicates a thickness of the layer 31, and H2 indicates a thickness of the first blocking layer 41.

Figure 5B:
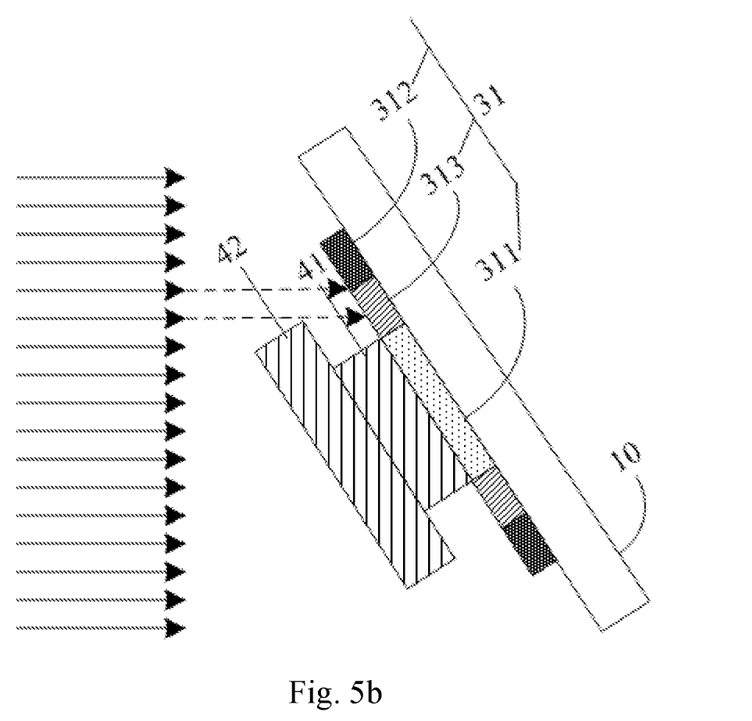

Similarly, as shown in FIG. 5b, the substrate 10 is rotated counterclockwise by the preset angle A in a direction parallel to the ion beam, and a second doping is performed on the layer 31 again with the ion beam, to realize doping of the second region 313 over the first region 311.

In practice, in an exemplary embodiment, both the first doping and the second doping can be performed in an ion beam implantation apparatus. The substrate in an exemplary embodiment, can be placed on a platform of the ion beam implantation apparatus. The platform of the ion beam implantation apparatus can be rotated by various angles, and it is not required to provide a rotation axis separately. The effect of variation in a distance between the ion beam and the substrate due to substrate rotation on the ion implantation depth can be controlled according to the setting of ion acceleration voltage. Particularly, experimental measurements can be conducted by comparing with electrical characteristics of the regular perpendicular implantation mode. In the case of substrate rotation, the ion implanted region is a trapezoid region, and a triangular region is absent as compared with a cuboid region in the regular perpendicular implantation mode. In practice, a match with electrical characteristics in the regular perpendicular implantation mode can be realized by adjusting the dose for ion implantation.

Finally, in an exemplary embodiment, after performing the second doping on the layer with the ion beam, the method further comprises: removing the first blocking layer and the second blocking layer to form a doped layer. In practice, in an exemplary embodiment, the first blocking layer and the second blocking layer can be removed by ashing and dry etching, or by stripping.

In the above method for doping a layer according to exemplary embodiments, doping of the heavily doped region and doping of the lightly doped region can be realized in a same ion beam implantation apparatus at the same time. Otherwise, it would be required to reload the substrate in an etching apparatus after doping of the heavily doped region, to remove the blocking layer right above the lightly doped region, and reload into the ion beam implantation apparatus for doping the lightly doped region. Thus, exemplary embodiments can simplify the process, improve the capacity, and increase the yield of product.

Figure 6:
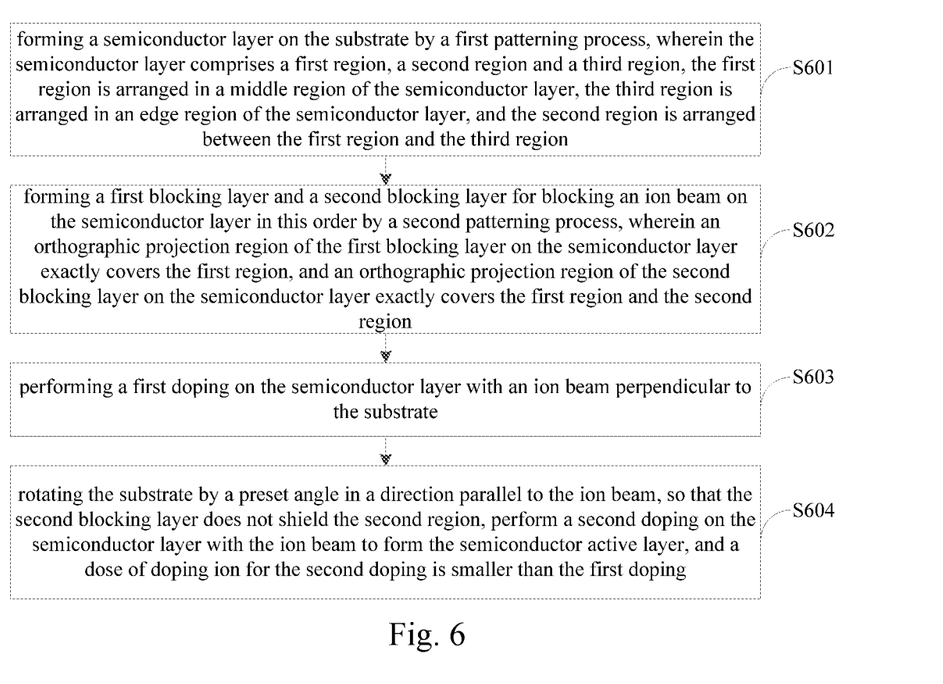
FIG. 6 is a flow chart for a method for fabricating a thin film transistor in an exemplary embodiment.

On basis of the same inventive concept, in an exemplary embodiment, a method for fabricating a thin film transistor is further provided, as shown in FIG. 6, comprising forming a gate, a source, a drain and a semiconductor active layer, wherein forming the semiconductor active layer comprises:

S601, forming a semiconductor layer on the substrate by a first patterning process, wherein the semiconductor layer comprises a first region, a second region and a third region, the first region is arranged in a middle region of the semiconductor layer, the third region is arranged in an edge region of the semiconductor layer, and the second region is arranged between the first region and the third region;

S602, forming a first blocking layer and a second blocking layer for blocking an ion beam on the semiconductor layer in this order by a second patterning process, wherein an orthographic projection region of the first blocking layer on the semiconductor layer exactly covers the first region, and an orthographic projection region of the second blocking layer on the semiconductor layer exactly covers the first region and the second region;

S603, performing a first doping on the semiconductor layer with an ion beam perpendicular to the substrate;

S604, rotating the substrate by a preset angle in a direction parallel to the ion beam, so that the second blocking layer does not shield the second region, perform a second doping on the semiconductor layer with the ion beam to form the semiconductor active layer, and a dose of doping ion for the second doping is smaller than the first doping.

In particular, the first region is the undoped region of the semiconductor layer, the second region is a lightly doped region of the semiconductor layer, and the third region is a heavily doped region of the semiconductor layer.

In an exemplary embodiment, the formed thin film transistor can be a top-gate thin film transistor, or a bottom-gate thin film transistor. Of course, other type of thin film transistor is also possible, e.g., a side-gate thin film transistor.

A method for fabricating a thin film transistor, in an exemplary embodiment, will be described by referring to a top-gate thin film transistor and a bottom-gate thin film transistor.

Figure 7:
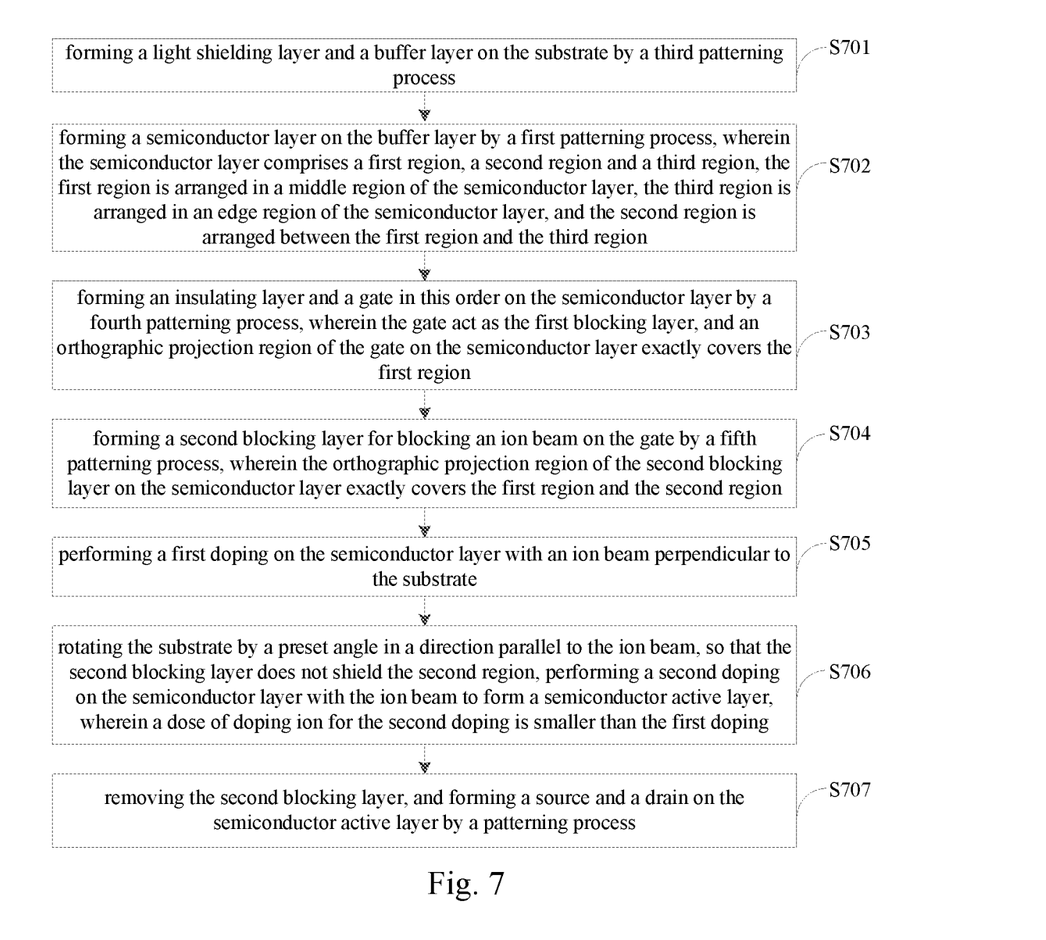
FIG. 7 is a flow chart method for fabricating a top-gate thin film transistor in an exemplary embodiment.

As shown in FIG. 7, in an exemplary embodiment, a method for fabricating a thin film transistor comprises:

S701, forming a light shielding layer and a buffer layer on the substrate by a third patterning process;

S702, forming a semiconductor layer on the buffer layer by a first patterning process, wherein the semiconductor layer comprises a first region, a second region and a third region, the first region is arranged in a middle region of the semiconductor layer, the third region is arranged in an edge region of the semiconductor layer, and the second region is arranged between the first region and the third region;

S703, forming an insulating layer and a gate in this order on the semiconductor layer by a fourth patterning process, wherein the gate act as the first blocking layer, and an orthographic projection region of the gate on the semiconductor layer exactly covers the first region;

S704, forming a second blocking layer for blocking an ion beam on the gate by a fifth patterning process, wherein the orthographic projection region of the second blocking layer on the semiconductor layer exactly covers the first region and the second region;

S705, performing a first doping on the semiconductor layer with an ion beam perpendicular to the substrate;

S706, rotating the substrate by a preset angle in a direction parallel to the ion beam, so that the second blocking layer does not shield the second region, performing a second doping on the semiconductor layer with the ion beam to form a semiconductor active layer, wherein a dose of doping ion for the second doping is smaller than the first doping;

S707, removing the second blocking layer, and forming a source and a drain on the semiconductor active layer by a patterning process.

In particular, in an exemplary embodiment, rotating the substrate by a preset angle in a direction parallel to the ion beam, so that the second blocking layer does not shield the second region, performing a second doping on the semiconductor layer with the ion beam to form the semiconductor active layer, particularly comprises:

rotating the substrate clockwise by a preset angle in the direction parallel to the ion beam, so that the second blocking layer does not shield the second region, performing a second doping on the semiconductor layer with the ion beam, and, rotating the substrate counterclockwise by a preset angle in a direction parallel to the ion beam, so that the second blocking layer does not shield the second region, and perform the second doping again on the semiconductor layer with the ion beam to form the semiconductor active layer.

A process for fabricating a thin film transistor in the exemplary embodiment shown in FIG. 7 will be described in detail by referring to the accompanying drawings.

Figure 8:
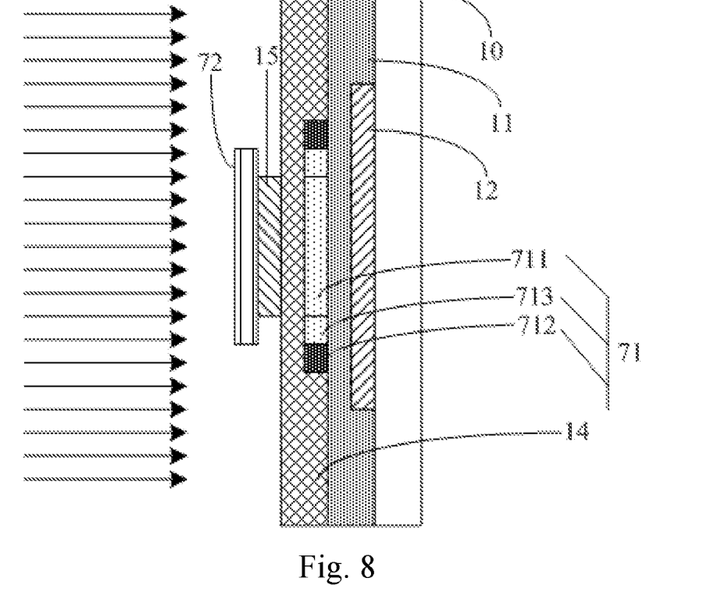
FIGS. 8, 9a, 9b and 10 are structural views for different stages of a process for fabricating a top-gate thin film transistor in an exemplary embodiment.

As shown in FIG. 8, firstly, the light shielding layer 12 and the buffer layer 11 are formed on the substrate 10 by a patterning process. In an exemplary embodiment, the method for fabricating the light shielding layer 12 and the buffer layer 11 is identical with the existing technique, which is not repeated here for simplicity. Then, a semiconductor layer 71 is formed on the buffer layer 11 by a patterning process. The semiconductor layer 71 comprises a first region 711, a second region 713 and a third region 712. The first region 711 is arranged in the middle region of the semiconductor layer 71, the third region 712 is arranged in an edge region of the semiconductor layer 71, and the second region 713 is arranged between the first region 711 and the third region 712. The first region 711 corresponds to an undoped region of the semiconductor layer 71, the third region 712 corresponds to a heavily doped region of the semiconductor layer 71, and the second region 713 corresponds to the lightly doped region. In an exemplary embodiment, the method for forming the semiconductor layer 71 is similar with the existing technique, which is not repeated here for simplicity. Then, the insulating layer 14 and the gate 15 are formed on the semiconductor layer 71 by a patterning process in this order. In an exemplary embodiment, the method for forming the insulating layer 14 and the gate 15 is identical with the existing technique, which is not repeated here for simplicity. As shown in the exemplary embodiment of FIG. 7, the gate 15 acts as the blocking layer in the subsequent doping processes.

As shown in FIG. 8, then, a second blocking layer 72 is formed on the gate 15 by a patterning process. In practice, the second blocking layer 72 can be made from a photoresist layer, and an orthographic projection region of the second blocking layer 72 on the semiconductor layer 71 exactly covers the first region 711 and the second region 713.

As shown in FIG. 8, then, a first doping is performed on the semiconductor layer 71 with an ion beam perpendicular to the substrate 10. During the first doping, since the first region 711 and the second region 713 are shielded the gate 15 and the second blocking layer 72, the first region 711 and the second region 713 of the semiconductor layer 71 are not doped during the first doping. In an exemplary embodiment, during the first doping, the doping ion is implanted by the ion beam at a relatively large dose, e.g., n type doping ion or p type doping ion with a relatively large implantation dose.

Figure 9A:
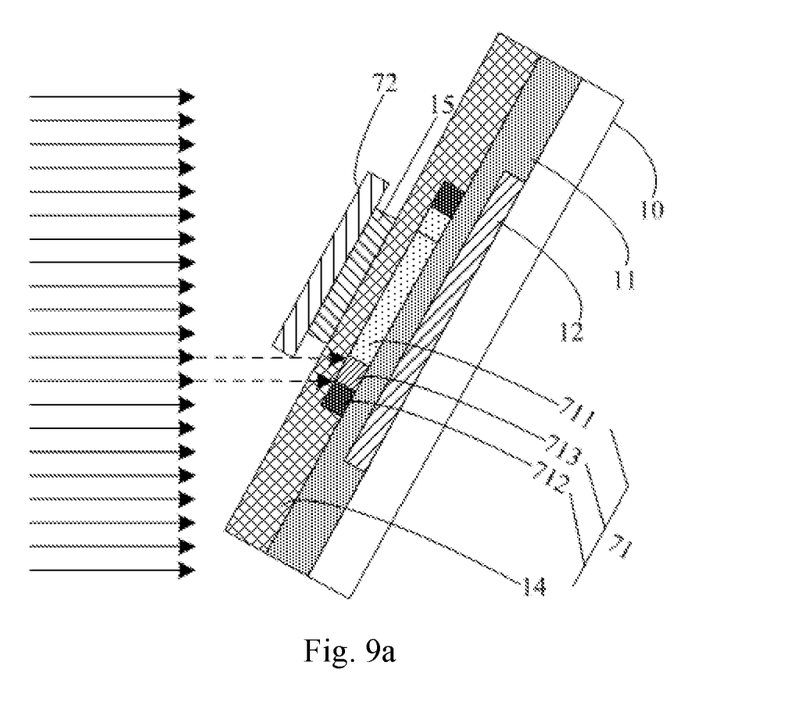

Then, as shown in FIG. 9a, the substrate 10 is rotated clockwise by the preset angle A in a direction parallel to the ion beam, so that the second blocking layer 72 does not shield the second region 713, and the second doping is performed on the semiconductor layer 71 with the ion beam. In an exemplary embodiment, during the second doping, the doping ion is implanted by the ion beam at a relatively small dose. In an exemplary embodiment, the preset angle A to rotate is such an angle that after rotation in the direction parallel to the ion beam by the preset angle A, the substrate 10 can expose the second region 713, so that the second region 713 can be doped with the ion beam.

In practice, the preset angle A satisfies $\tan A = L/(H1+H2+H3)$; wherein L indicates a length of the second region of the semiconductor layer in a preset direction (e.g., of the second region in a direction parallel to the substrate 10), H1 indicates a thickness of the semiconductor layer 71, H2 indicates a thickness of a portion of the insulating layer 14 which is arranged right above the second region 713, H3 indicates a thickness of the gate 15. For example, in an exemplary embodiment, the length of the second region of the semiconductor layer in a direction parallel to the substrate 10 is 0.25 µm, the thickness of the semiconductor layer 71 is 500 angstrom (Å), the thickness of the insulating layer 14 is 1200 Å, and the thickness of the gate 15 is 2200 Å. According to the above equation, the preset angle A is 33°.

Figure 9B:
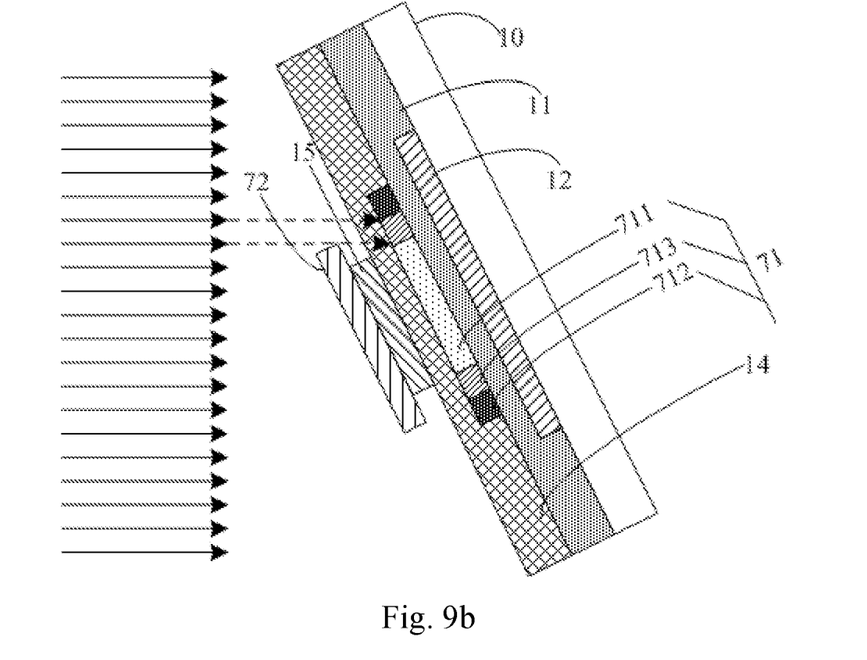

Similarly, as shown in FIG. 9b, the substrate 10 is rotated counterclockwise in a direction parallel to the ion beam by the preset angle A, and the second doping is performed on the semiconductor layer 71 again with the ion beam, to form the semiconductor active layer.

In practice, in an exemplary embodiment, both the first doping and the second doping can be performed in an ion beam implantation apparatus. In an exemplary embodiment, the substrate can be placed on a platform of the ion beam implantation apparatus. The platform of the ion beam implantation apparatus can be rotated by various angles, and it is not required to provide a rotation axis separately. In this way, the ion beam can be implanted not only in the direction perpendicular to the substrate, but also at an angle with respect to the substrate. In an exemplary embodiment, during doping the semiconductor layer to form the semiconductor active layer, it is not required to remove the blocking layer over lightly doped region by ashing and etching, and the doping ion can still be implanted into the lightly doped region. This improves control over the process and various parameters, eliminates the problem of photoresist residual due to degeneration of the photoresist. Thus, this simplifies the process, improves the capacity, and increases the yield of product.

Figure 10:
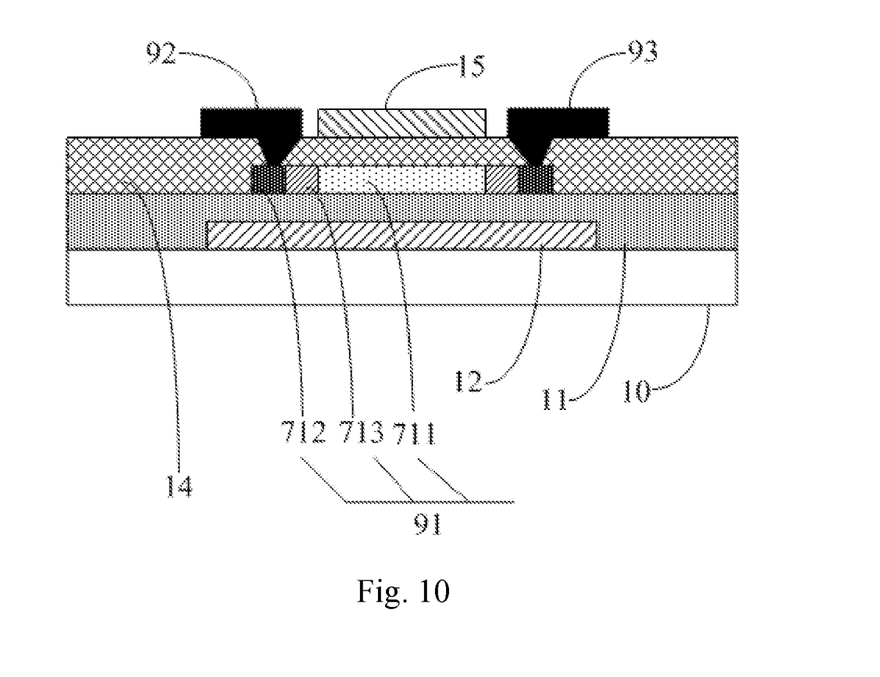

Finally, as shown in FIG. 10, the second blocking layer is removed, and a source 92 and a drain 93 are formed on a semiconductor active layer 91 by a patterning process. In an exemplary embodiment, the source 92 and the drain 93 are formed by processes identical with the existing technique, which are not repeated here for simplicity. In practice, in an exemplary embodiment, the second blocking layer can be removed by ashing and etching, or by stripping.

In case the above method is applied to fabricate a thin film transistor, during forming the semiconductor active layer, in exemplary embodiments, it is not required to transfer the substrate which has been subject to the first doping (i.e., the first doping of the semiconductor layer) into an etching apparatus to etch the blocking layer right above the lightly doped region. The second blocking layer can be retained. At this point of time, the doping of the lightly doped region can be realized by rotating the substrate by a preset angle. Both heavily doped region and the lightly doped region can be realized in a same ion beam implantation apparatus, and there is not need for ashing and etching.

Figure 11:
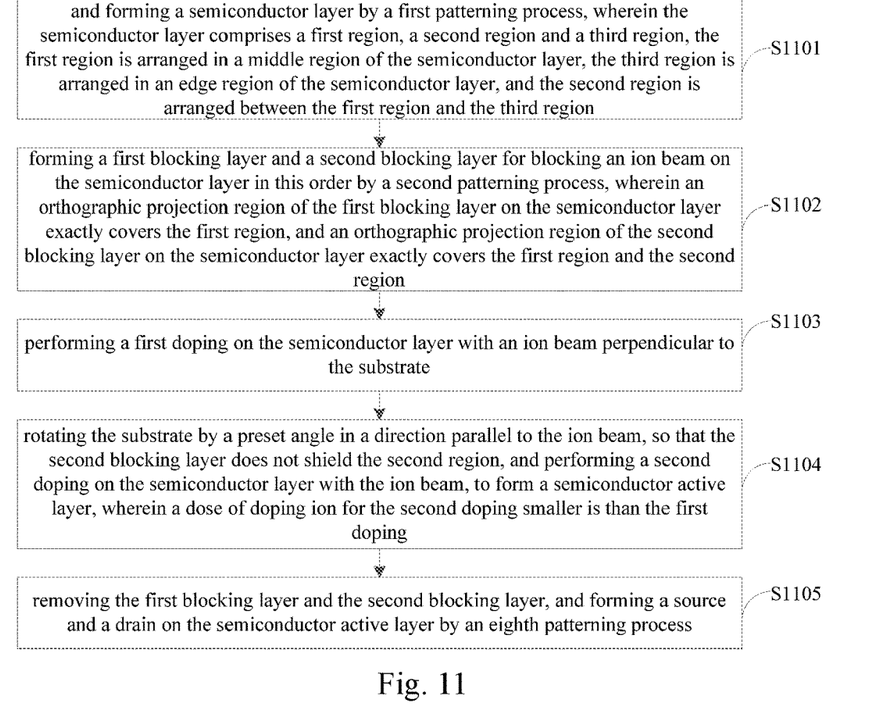
FIG. 11 is a flow chart for a method for fabricating a bottom-gate thin film transistor in an exemplary embodiment.

As shown in FIG. 11, a method for fabricating a thin film transistor according to an exemplary embodiment comprises:

S1101, forming a gate and an insulating layer on the substrate by a seventh patterning process and forming a semiconductor layer by a first patterning process, wherein the semiconductor layer comprises a first region, a second region and a third region, the first region is arranged in a middle region of the semiconductor layer, the third region is arranged in an edge region of the semiconductor layer, and the second region is arranged between the first region and the third region;

S1102, forming a first blocking layer and a second blocking layer for blocking an ion beam on the semiconductor layer in this order by a second patterning process, wherein an orthographic projection region of the first blocking layer on the semiconductor layer exactly covers the first region, and an orthographic projection region of the second blocking layer on the semiconductor layer exactly covers the first region and the second region;

S1103, performing a first doping on the semiconductor layer with an ion beam perpendicular to the substrate;

S1104, rotating the substrate by a preset angle in a direction parallel to the ion beam, so that the second blocking layer does not shield the second region, and performing a second doping on the semiconductor layer with the ion beam, to form a semiconductor active layer, wherein a dose of doping ion for the second doping smaller is than the first doping;

S1105, removing the first blocking layer and the second blocking layer, and forming a source and a drain on the semiconductor active layer by an eighth patterning process.

In particular, in an exemplary embodiment, rotating the substrate by a preset angle in a direction parallel to the ion beam, so that the second blocking layer does not shield the second region, performing a second doping on the semiconductor layer with the ion beam to form the semiconductor active layer, particularly comprises:

rotating the substrate clockwise by a preset angle in the direction parallel to the ion beam, so that the second blocking layer does not shield the second region, performing a second doping on the semiconductor layer with the ion beam, and, rotating the substrate counterclockwise by a preset angle in a direction parallel to the ion beam, so that the second blocking layer does not shield the second region, performing the second doping again on the semiconductor layer with the ion beam to form the semiconductor active layer.

The process for fabricating a thin film transistor in an exemplary embodiment will be described hereafter by referring to the accompanying drawings.

Figure 12:
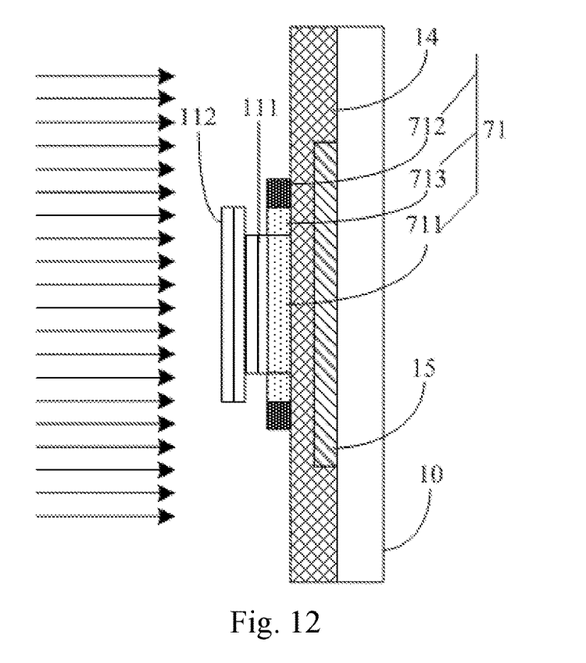
FIGS. 12, 13a, 13b and 14 are structural views for different stages of a process for fabricating a bottom-gate thin film transistor in an exemplary embodiment.

As shown in FIG. 12, firstly, the gate 15, the insulating layer 14 and the semiconductor layer 71 are formed on the substrate 10 in this order by a patterning process. The semiconductor layer 71 comprises the first region 711, the second region 713 and the third region 712. The first region 711 is arranged in a middle region of the semiconductor layer 71, the third region 712 is arranged in an edge region of the semiconductor layer 71, and the second region 713 is arranged between the first region 711 and the third region 712. The first region 711 corresponds to an undoped region of the semiconductor layer 71, the third region 712 corresponds to a heavily doped region of the semiconductor layer 71, and the second region 713 corresponds to a lightly doped region of the semiconductor layer 71. In an exemplary embodiment, the gate 15, the insulating layer 14 and the semiconductor layer 71 can be formed by a process similar with the existing technique, which is not repeated here for simplicity.

Then, as shown in FIG. 12, a first blocking layer 111 and a second blocking layer 112 are formed on the semiconductor layer 71 by a patterning process in this order. An orthographic projection region of the first blocking layer 111 on the semiconductor layer 71 exactly covers the first region 711, and an orthographic projection region of the second blocking layer 112 on the semiconductor layer 71 exactly covers the first region 711 and the second region 713. In an exemplary embodiment of the present disclosure, the first blocking layer 111 and the second blocking layer 112 are made from a same material. In practice, the first blocking layer 111 and the second blocking layer 112 can be made from a photoresist layer.

As shown in FIG. 12, a first doping is performed on the semiconductor layer 71 with an ion beam perpendicular to the substrate 10. During the first doping, since the first region 711 and the second region 713 are shielded by the first blocking layer 111 and the second blocking layer 112, the first region 711 and the second region 713 of the semiconductor layer 71 are not doped during the first doping. In an exemplary embodiment, during the first doping, the doping ion is implanted by the ion beam at a relatively large dose, e.g., an n type doping ion or p type doping ion with a relatively large implantation dose.

Figure 13A:
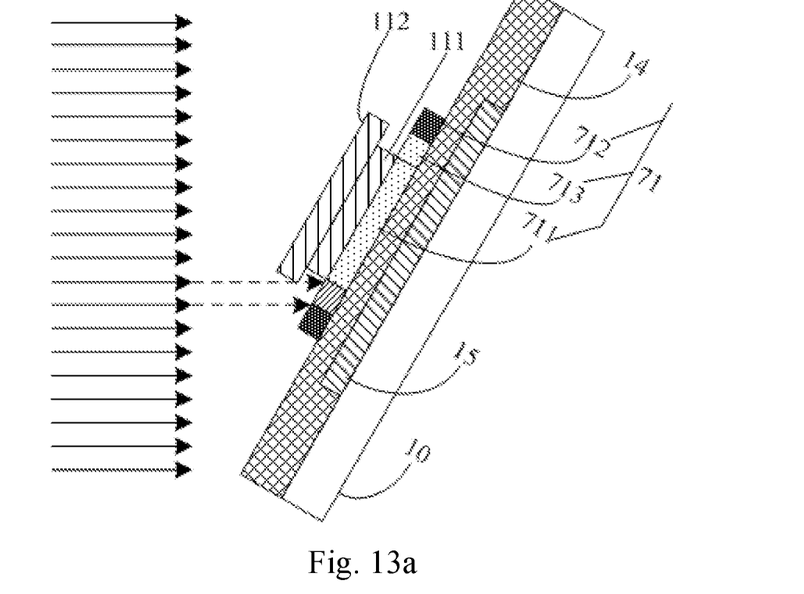

Then, as shown in FIG. 13a, the substrate 10 is rotated clockwise by the preset angle A in a direction parallel to the ion beam, so that the second blocking layer 112 does not shield the second region 713, and a second doping is performed on the semiconductor layer 71 with the ion beam. In an exemplary embodiment, during the second doping, the doping ion is implanted by the ion beam at a relatively small dose, the preset angle A to rotate is such an angle that after rotation in the direction parallel to the ion beam by the preset angle A, the substrate 10 can expose the second region 713. In practice, the preset angle A satisfies tan $A = L/(H1+H2)$, wherein L indicates a length of the second region of the semiconductor layer in a preset direction (e.g., a length of the second region in a direction parallel to the substrate 10), H1 indicates a thickness of the semiconductor layer 71, and H2 indicates a thickness of the first blocking layer 111.

Figure 13B:
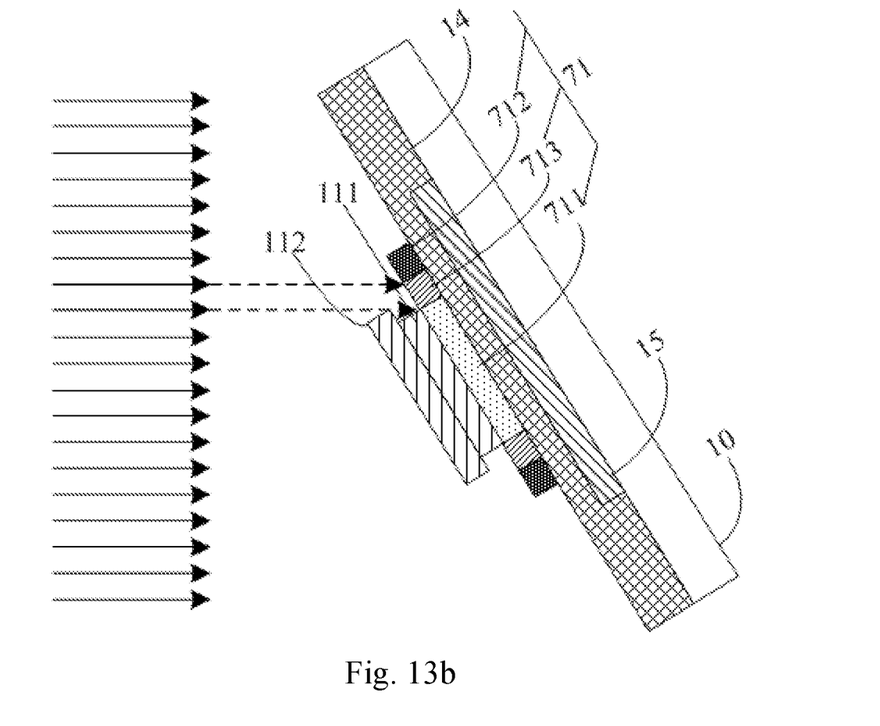

Similarly, as shown in FIG. 13b, the substrate 10 is rotated counterclockwise by the preset angle A in a direction parallel to the ion beam, and the second doping is performed again with the ion beam on the semiconductor layer 71 to form the semiconductor active layer 91.

In practice, in an exemplary embodiment, both the first doping and the second doping can be realized in an ion beam implantation apparatus. The substrate can be placed on a platform of the ion beam implantation apparatus. The platform of the ion beam implantation apparatus can be rotated by various angles, and it is not required to provide a separate rotation axis.

Figure 14:
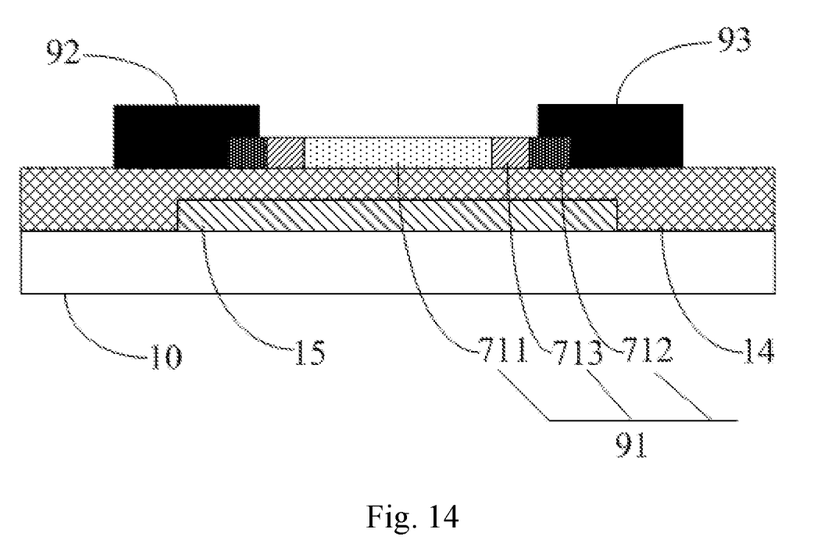

Finally, as shown in FIG. 14, the first blocking layer and the second blocking layer are removed, the source 92 and the drain 93 are formed on the semiconductor active layer 91 by a patterning process. In an exemplary embodiment, the source 92 and the drain 93 are formed by processes identical with the existing technique, which are not repeated here for simplicity. In practice, the first blocking layer and the second blocking layer can be removed by ashing and etching, or by stripping.

On basis of the same inventive concept, in an exemplary embodiment, a thin film transistor is further provided. The thin film transistor is fabricated by the method in the above embodiments.

To sum up, in exemplary embodiments, a method for doping a layer, comprises: forming a layer to be doped on the substrate by a patterning process, wherein the layer comprises a first region, a second region and a third region, the first region is arranged in a middle region of the layer, the third region is arranged in an edge region of the layer, and the second region is arranged between the first region and the third region; forming a first blocking layer and a second blocking layer for blocking an ion beam on the layer in this order by a patterning process, wherein an orthographic projection region of the first blocking layer on the layer exactly covers the first region, an orthographic projection region of the second blocking layer on the layer exactly covers the first region and the second region; performing a first doping on the layer with an ion beam perpendicular to the substrate, to realize doping of the third region; rotating the substrate by a preset angle in a direction parallel to the ion beam, so that the second blocking layer does not shield the second region, and performing a second doping on the layer with the ion beam to realize doping of the second region; wherein the second doping has a dose of doping ion smaller than the first doping. By adopting the above method for doping a layer in embodiments of the present disclosure, the second region and the third region can be doped in a same ion beam implantation apparatus. After the doping of the third region, it is not required to reload the substrate into the etching apparatus to remove the blocking layer right above the second region. Thus, exemplary embodiments can simplify the process, improve the capacity, and increase the yield of product.

It will be understood that a person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. A method for doping a layer, comprising:
    forming a layer to be doped on a substrate by a first patterning process, wherein the layer comprises a first region, a second region and a third region, the first region is arranged in a middle region of the layer, the third region is arranged in an edge region of the layer, and the second region is arranged between the first region and the third region;
    forming a first blocking layer and a second blocking layer for blocking an ion beam on the layer in this order by a second patterning process, wherein an orthographic projection region of the first blocking layer on the layer exactly covers the first region, and an orthographic projection region of the second blocking layer on the layer exactly covers the first region and the second region;
    performing a first doping on the layer with an ion beam perpendicular to the substrate, to realize doping of the third region; and
    rotating the substrate clockwise by a preset angle A in a direction parallel to the ion beam, so that the second blocking layer does not shield the second region, and performing a second doping on the layer with the ion beam, and rotating the substrate counterclockwise by the preset angle A in the direction parallel to the ion beam, so that the second blocking layer does not shield the second region, and performing the second doping on the layer again with the ion beam to realize doping of the second region,
    wherein the preset angle A satisfies tan $A=L/(H1+H2)$, wherein L indicates a length of the second region in a preset direction, H1 indicates a thickness of the layer, and H2 indicates a thickness of the first blocking layer.

2. The doping method of claim 1, wherein the first blocking layer and the second blocking layer are made from a same material.

3. The doping method of claim 1, wherein after performing the second doping on the layer with the ion beam, the method further comprises: removing the first blocking layer and the second blocking layer to form a doped layer.

4. The doping method of claim 1, wherein a dose of doping ion for the second doping smaller is than the first doping.

5. A method for fabricating a thin film transistor, comprising forming a gate, a source electrode, a drain electrode, and a semiconductor active layer, wherein forming the semiconductor active layer comprises:
    forming a semiconductor layer on the substrate by a first patterning process, wherein the semiconductor layer comprises a first region, a second region and a third region, the first region is arranged in a middle region of the semiconductor layer, the third region is arranged in an edge region of the semiconductor layer, and the second region is arranged between the first region and the third region;
    forming an insulating layer and a gate on the semiconductor layer in this order by a fourth patterning process, wherein an orthographic projection region of the gate on the semiconductor layer exactly covers the first region, and forming a second blocking layer for blocking an ion beam on the gate by a fifth patterning process, wherein an orthographic projection region of the second blocking layer on the semiconductor layer exactly covers the first region and the second region;
    performing a first doping on the semiconductor layer with an ion beam perpendicular to the substrate; and
    rotating the substrate by a preset angle A in a direction parallel to the ion beam, so that the second blocking layer does not shield the second region, and performing a second doping on the semiconductor layer with the ion beam, to form a semiconductor active layer
    wherein the preset angle A satisfies tan $A=L/(H1+H2+H3)$, wherein L indicates a length of the second region in a preset direction, H1 indicates a thickness of the semiconductor layer, H2 indicates a thickness of a portion of the insulating layer which is arranged right above the second region, and H3 indicates a thickness of the gate.

6. The fabricating method of claim 5, wherein prior to forming the semiconductor layer on the substrate by the first patterning process, the method further comprises:
    forming a light shielding layer and a buffer layer on the substrate by a third patterning process.

7. The fabricating method of claim 5, wherein after forming the semiconductor active layer, the method further comprises:
    removing the second blocking layer, and
    forming the source electrode and the drain electrode on the semiconductor active layer by a sixth patterning process.

8. The fabricating method of claim 5, wherein a dose of doping ion for the second doping smaller is than the first doping.

9. The fabricating method of claim 5, wherein rotating the substrate by the preset angle A in the direction parallel to the ion beam, so that the second blocking layer does not shield the second region, and performing the second doping on the semiconductor layer with the ion beam, to form the semiconductor active layer, comprises:
    rotating the substrate clockwise by the preset angle A in the direction parallel to the ion beam, so that the second blocking layer does not shield the second region, performing the second doping on the semiconductor layer with the ion beam, and, rotating the substrate counterclockwise by the preset angle A in the direction parallel to the ion beam, so that the second blocking layer does not shield the second region, performing the second doping on the semiconductor layer again with the ion beam, to form the semiconductor active layer.

10. A thin film transistor fabricated by the method of claim 5.

11. A method for fabricating a thin film transistor, comprising forming a gate, a source electrode, a drain electrode, and a semiconductor active layer, wherein forming the semiconductor active layer comprises:
    forming a semiconductor layer on the substrate by a first patterning process, wherein the semiconductor layer comprises a first region, a second region and a third region, the first region is arranged in a middle region of the semiconductor layer, the third region is arranged in an edge region of the semiconductor layer, and the second region is arranged between the first region and the third region;

forming a first blocking layer and a second blocking layer for blocking an ion beam on the semiconductor layer in this order by a second patterning process, wherein an orthographic projection region of the first blocking layer on the semiconductor layer exactly covers the first region, and an orthographic projection region of the second blocking layer on the semiconductor layer exactly covers the first region and the second region;

performing a first doping on the semiconductor layer with an ion beam perpendicular to the substrate; and rotating the substrate by a preset angle A in a direction parallel to the ion beam, so that the second blocking layer does not shield the second region, and performing a second doping on the semiconductor layer with the ion beam, to form a semiconductor active layer wherein the preset angle A satisfies tan $A=L/(H1+H2)$, wherein L indicates a length of the second region in a preset direction, H1 indicates a thickness of the semiconductor layer, and H2 indicates a thickness of the first blocking layer.

12. The fabricating method of claim 11, wherein a dose of doping ion for the second doping smaller is than the first doping.

13. The fabricating method of claim 11, wherein rotating the substrate by the preset angle A in the direction parallel to the ion beam, so that the second blocking layer does not shield the second region, and performing the second doping on the semiconductor layer with the ion beam, to form the semiconductor active layer, comprises:

rotating the substrate clockwise by the preset angle A in the direction parallel to the ion beam, so that the second blocking layer does not shield the second region, performing the second doping on the semiconductor layer with the ion beam, and, rotating the substrate counterclockwise by the preset angle A in the direction parallel to the ion beam, so that the second blocking layer does not shield the second region, performing the second doping on the semiconductor layer again with the ion beam, to form the semiconductor active layer.

14. A thin film transistor fabricated by the method of claim 11.

15. The fabricating method of claim 11, wherein prior to forming the semiconductor layer on the substrate by the first patterning process, the method further comprises:

forming a gate and an insulating layer on the substrate in this order by a seventh patterning process.

16. The fabricating method of claim 15, wherein after forming the semiconductor active layer, the method further comprises:

removing the first blocking layer and the second blocking layer, and forming the source electrode and the drain electrode on the semiconductor active layer by an eighth patterning process.

17. The fabricating method of claim 16, wherein the first blocking layer and the second blocking layer are made from a same material.

* * * * *